(12) United States Patent
Barth et al.

(10) Patent No.: US 8,525,347 B2
(45) Date of Patent: Sep. 3, 2013

(54) METHOD FOR PRODUCING CHIP STACKS, AND ASSOCIATED CHIP STACKS

(75) Inventors: Hans-Joachim Barth, Munich (DE); Harald Seidl, Poering (DE)

(73) Assignee: Infineon Technologies AG, Neubiberg (DE)

( * ) Notice: Subject to any disclaimer, the term of this patent is extended or adjusted under 35 U.S.C. 154(b) by 1143 days.

(21) Appl. No.: 11/416,712

(22) Filed: May 3, 2006

(65) Prior Publication Data

US 2009/0014889 A1    Jan. 15, 2009

(30) Foreign Application Priority Data

May 12, 2005  (DE) .................. 10 2005 022 017

(51) Int. Cl.
*H01L 23/52*  (2006.01)

(52) U.S. Cl.
USPC ............... 257/777; 257/620; 257/E21.001; 438/109; 438/107; 438/113; 438/110

(58) Field of Classification Search
USPC ............... 257/777, 620, E21.001; 438/109, 438/107, 113, 110
See application file for complete search history.

(56) References Cited

U.S. PATENT DOCUMENTS

| | | | |
|---|---|---|---|
| 5,185,292 A | 2/1993 | VanVonno et al. | 437/180 |
| 5,691,248 A | 11/1997 | Cronin et al. | 437/227 |
| 6,936,929 B1 * | 8/2005 | Mostafazadeh et al. | 257/778 |
| 2003/0080410 A1 | 5/2003 | Shibata | 257/700 |
| 2004/0063268 A1 * | 4/2004 | Noma et al. | 438/202 |
| 2004/0256734 A1 * | 12/2004 | Farnworth et al. | 257/777 |
| 2006/0057836 A1 * | 3/2006 | Nagarajan et al. | 438/622 |

FOREIGN PATENT DOCUMENTS

| | | |
|---|---|---|
| DE | 195 16487 | 5/1995 |
| DE | 10234 208 | 7/2002 |
| DE | 102 46 728 | 10/2002 |
| EP | 1 094 511 | 10/2000 |
| WO | WO 02/20211 | 9/2000 |
| WO | WO 01/29881 | 10/2000 |
| WO | WO 2004/068573 | 12/2003 |
| WO | WO 2004/086497 | 3/2004 |

OTHER PUBLICATIONS

German Office Action, dated Jan. 16, 2006 (6 pages) (English Translation).

* cited by examiner

*Primary Examiner* — Junghwa M Im

(57) ABSTRACT

The present disclosures relates to a method for producing ultrathin chip stacks and chip stacks. Generally, a plurality of first semiconductor chips is formed in a wafer. A second semiconductor chip is applied to each of the plurality of first semiconductor chips via a connection layer and a stabilization layer is applied to fill in the interspace between each of the second semiconductor chips. The wafer, semiconductor chip, and stabilization layer are thinned and the wafer is sawed to produce a plurality of singulated chip stacks.

8 Claims, 8 Drawing Sheets

METHOD FOR PRODUCING CHIP STACKS, AND ASSOCIATED CHIP STACKS

RELATED APPLICATIONS

The present patent document claims priority of German Application Serial No. DE 10 2005 022 017.7, filed May 12, 2005, the entirety of which is hereby incorporated by reference.

BACKGROUND

The present disclosure relates to a method for producing chip stacks and to associated chip stacks, and in particular to a method for producing ultrathin chip stacks having a total thickness of less than 500 µm.

In order to reduce costs or in order to realize highly complex semiconductor circuits, use is increasingly being made of so-called chip stacks, two semiconductor components provided with semiconductor circuits, or so-called chips being connected to one another by means of e.g. the so-called face-to-face (F2F) or SOLID method. To put it more precisely, in this case a first partial semiconductor circuit may be formed in one semiconductor component or semiconductor chip and a second partial semiconductor circuit may be realized in a second semiconductor component or semiconductor chip, which partial semiconductor circuits enable an overall functionality when connected up together.

In this case, either analog or radio frequency circuits or memory modules of digital semiconductor circuits may be separated locally or in particular semiconductor partial circuits, which require a cost-intensive processing, of semiconductor circuits which enable a cost-effective realization may subsequently be combined, whereby the production costs can be reduced to a remarkable extent.

In the case of the face-to-face or SOLID methods such as are disclosed for example in the documents WO2004/086497 and WO2004/068573 for the so-called 3D mounting or vertical processing of semiconductor components or semiconductor chips on a processed wafer with still unsingulated semiconductor chips, singulated semiconductor chips are soldered "face-down", that is to say with their processed surface onto a processed wafer. This is done using F2F pads (Face-to-Face) and F2F metal tracks which are approximately 15×15 µm size and are embodied for example from thick Cu layers in the lower wafer and as a thick Cu layer with an overlying Sn layer on the semiconductor chips to be mounted. Metal tracks or pads of this type are referred to hereinafter as chip connection areas.

After alignment of the semiconductor chip to be mounted above the associated chip connection areas (F2F pads and F2F metal tracks) of the further semiconductor chips formed in the wafer, the structures are soldered e.g. under protective gas atmosphere and at temperatures of approximately 300 degrees Celsius. In this case, an intermetallic $Cu_3Sn$ phase is formed as an electrically conductive connecting layer, which is stable up to 600 degrees Celsius after its shaping. A method for producing such a soldering connection or electrically conductive connecting layer is disclosed for example in the document WO02/20211A1.

Conventional semiconductor wafers have a thickness of approximately 700 µm, for which reason thicknesses of greater than 1400 µm arise for a resulting chip stack. However, a total thickness of less than 500 µm is required for a multiplicity of present-day and future applications in electronic components, and in particular of integrated circuits. Such thin semiconductor circuits or chip stacks have a very small mass and a very small structural height, for which reason they are of importance for a multiplicity of fields of application, for example in future disposable electronics and also for chip cards and smart cards.

For chip card applications, in particular, a total thickness of the ultrathin chip stacks should be less than 300 µm. However, as soon as such thin semiconductor chips having a thickness of less than 200 µm are mounted by means of an F2F method (Face-to-Face), alignment and adhesion problems are manifested particularly during soldering. The cause of these problems resides in the flexure of the thinned semiconductor chips which occurs on account of the intrinsic mechanical stress in the semiconductor chip.

On the other hand, however, it is also not possible for the singulated semiconductor chips that have already been soldered onto the semiconductor wafer simply to be thinned by grounding, since the soldering connections or the electrically conductive connecting layer is mechanically loaded to an excessively great extent and impermissibly degraded by the shering forces that occur in the course of thinning by grounding. This results in problems with regard to the reliability and yield. On the other hand, wet-chemical etching methods are likewise not possible since both the singulated semiconductor chips and the unsingulated semiconductor chips which, however, are still situated in the wafer have already been completely processed and would accordingly be damaged.

SUMMARY

Thus, the disclosure is based on the object of providing a method for producing chip stacks, and associated chip stacks which have a very small total thickness, have improved electrical properties and are cost-effective to produce.

In particular by means of filling the interspaces between the singulated semiconductor chips that have already been soldered onto the wafer with a stabilization layer up to at least a predetermined height, subsequently thinning said semiconductor chips, then thinning the wafer and finally sawing up the thinned wafer with the semiconductor chips soldered thereon in order to produce singulated chip stacks, it is possible for the first time to cost-effectively realize total thicknesses of less than 500 µm, and in particular less than 300 µm such as are required in particular for chip card applications. In this case, the soldering connections furthermore have outstanding electrical contacts between the semiconductor chips, thereby improving the electrical properties of the entire semiconductor circuit.

Preferably an insulating layer such as, for example, a spin-on glass, an epoxy resin, polyimide or photoimide is applied as the stabilization layer and is subsequently cured during a thermal step at less than 400 degrees Celsius, whereby an extremely high-quality mechanical stabilization is obtained in a particularly simple and cost-effective manner without the electrical properties of the semiconductor components formed in the semiconductor material being reduced in the process.

The stabilization layer may preferably have a multiplicity of partial layers that are successively applied and cured, thereby enabling an improved filling of the interspaces between the singulated semiconductor chips.

The stabilization layer may have a chemical mechanical planarization ("CMP") stop layer, for example, the thinning of the semiconductor chips mounted on the wafer involving carrying out a CMP method and stopping upon reaching the CMP stop layer. In this way, in particular the layer thicknesses of the semiconductor chips mounted on the wafer can be set highly precisely, for which reason layer thicknesses up to 50 µm can also be realized.

Furthermore, the semiconductor material of the semiconductor chips mounted on the wafer may also have an etching stop layer and in particular a buried $SiO_2$ layer (SiO substrate), whereby it is likewise possible for very thin layer thicknesses to be set highly precisely and, moreover, it is also possible to use pure wet-chemical etching methods for thinning which exert no mechanical loading whatsoever on the soldering connections or the connecting layer.

With regard to the chip stacks, a stabilization layer for the mechanical stabilization of the layer stack is formed at the side areas of the upper semiconductor chips and the connecting layer and also at a contact surface of the lower semiconductor chips.

Furthermore, the thinning of the semiconductor chips soldered onto the semiconductor wafer may be followed by the formation of openings for uncovering bonding connection areas at the contact surface of the wafer or the underlying semiconductor chips, as a result of which, in contrast to previous methods, the openings for the wire bonding and flip-chip pads are not uncovered until very late in the process and the connection areas or pads are thereby protected for as long as possible. Furthermore, it is thereby possible to obviate an additional phototechnology for freeing the connection areas of the stabilization layer according to the disclosure.

The disclosure is described in more detail below on the basis of exemplary embodiments with reference to the drawing.

DETAILED DESCRIPTION OF THE DRAWINGS

FIGS. 1A to 1G show simplified sectional views illustrating production steps of one embodiment of a method for producing ultrathin chip stacks. In accordance with FIG. 1A, as in the case of the conventional F2F method (Face-to-Face) or SOLID method mentioned in the introduction, on a wafer 1 with semiconductor chips CH1 that have been formed therein but have not yet been singulated, semiconductor chips CH2 that have already been singulated are applied, aligned and soldered with one another. Both the wafer 1, which preferably constitutes a semiconductor wafer and in particular a silicon semiconductor wafer, and the soldered-on second Si semiconductor chips CH2 initially have a standard thickness of approximately 700 µm such as is present in the case of semiconductor wafers "of normal thickness".

Figure 1A:
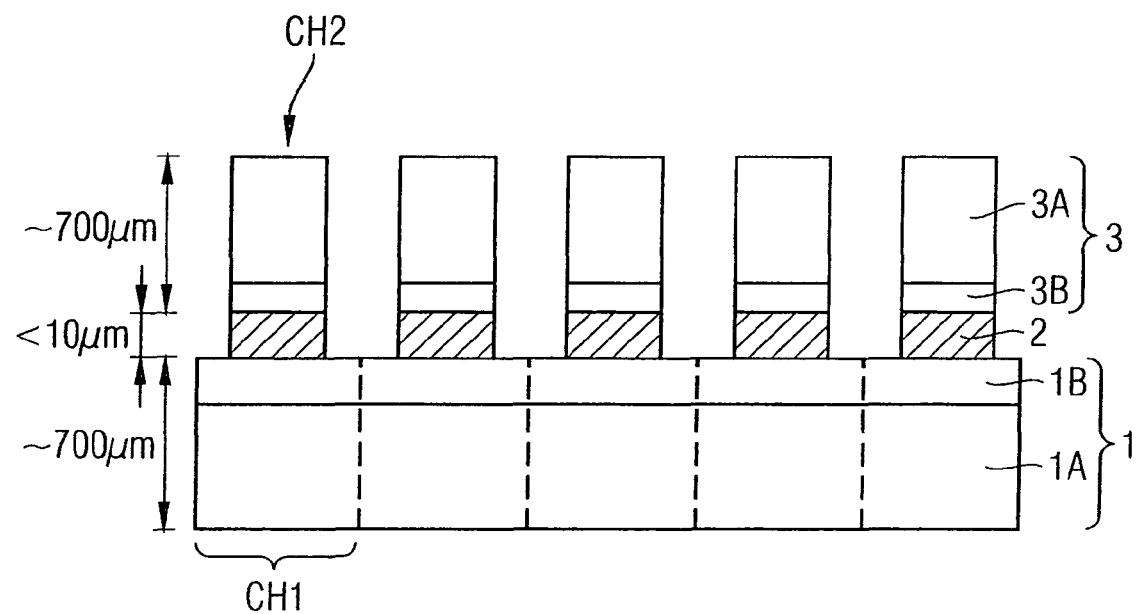
FIGS. 1A to 1G show simplified sectional views illustrating production steps of one embodiment of a method for producing ultrathin chip stacks.
Figure 1B:
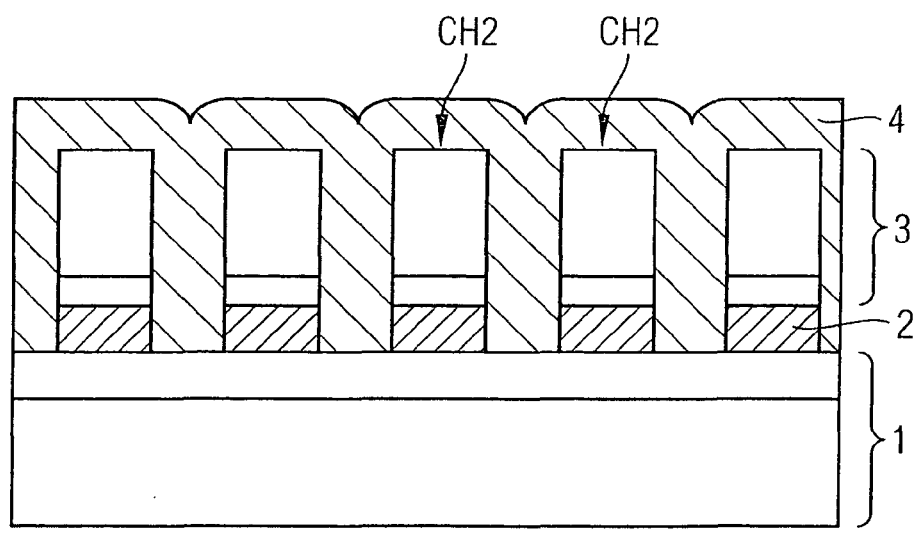

In accordance with FIG. 1A, 1B designates the already processed semiconductor regions of the semiconductor wafer 1 and also the overlying metallization, insulation and passivation layers. By contrast, the reference symbol 1A designates the unprocessed region of the wafer 1. In the same way, the reference symbol 3B designates the already processed layer regions with associated wiring planes, intermediate dielectrics and contact areas of the second semiconductor chips CH2 that have already been singulated, while 3A designates the unprocessed regions of the associated semiconductor material 3, which preferably likewise constitutes a silicon semiconductor material.

The connecting layer 2 comprises for example the soldering connection mentioned in the introduction, which soldering connection has an intermetallic $Cu_3Sn$ phase and is stable up to 600 degrees Celsius after its shaping. In principle, however, other soldering connections or materials are also conceivable as the connecting layer.

In accordance with FIG. 1B, the interspaces between the singulated second semiconductor chips CH2 are then filled with a stabilization layer 4 at least up to a predetermined height. In accordance with FIG. 1B, a Spin-on-Glass (SOG), epoxy resin, polyimide or photoactive photoimide is spun on over the whole area by means of a spin-on method, whereby the interspaces are completely filled and the second semiconductor chips CH2 are also completely covered at their surface. A thermal step may subsequently be carried out for the solidification or curing of the stabilization layer 4. The materials mentioned above can solidify or cure even at temperatures of less than 400 degrees Celsius, as a result of which the semiconductor components formed in the semiconductor crystal experience only little thermal loading and, consequently, the electrical properties remain virtually unchanged.

If required, it is also possible, for the realization of the stabilization layer 4, to apply a plurality of partial layers in successive spin-on and annealing or thermal sequences in order to enable an improved filling of the interspaces between the second semiconductor chips CH2 and to ensure an increased mechanical stabilization of the semiconductor chips CH2 and of the connecting layer 2. It goes without saying that combinations of different partial layers may also be applied.

Although a spin-on method is preferably carried out for spinning on the stabilization layer 4, other deposition methods such as e.g. CVD (Chemical Vapor Deposition), PECVD (Physical Enhanced Chemical Vapor Deposition), etc. are also possible in principle.

After the second semiconductor chips CH2 have been mechanically stabilized on the wafer 1 by the stabilization layer 4, the second semiconductor chips CH2 applied to the wafer 1 are then thinned. In principle, it is possible in this case for the second semiconductor chips CH2 to be mechanically ground back or etched back nonselectively, i.e. the same etching rate for the Si semiconductor material 3A and the stabilization layer 4, to a desired target thickness of approximately 50 to 200 µm. It goes without saying that combinations thereof are also possible.

In the course of this thinning, the stabilization layer 4 ensures that the soldered F2F connections or connecting layers 2, which usually have a thickness of less than 10 µm, are not damaged either mechanically or chemically. It is optionally possible for the stabilization layer 4 also to be at least partly etched back prior to the process of mechanical thinning by grinding.

Figure 1C:
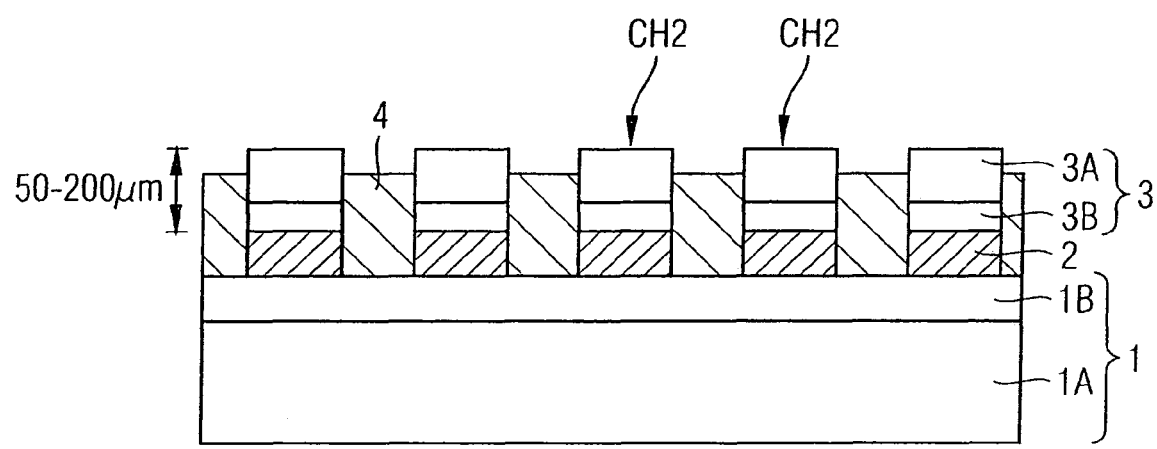

FIG. 1C shows a simplified sectional view after such a production step, the second semiconductor chips CH2 already having been thinned to their target thickness of approximately 50 to 200° µm and (optionally) the stabilization layer 4 having been etched back further after this thinning process. Preferably, the stabilization layer 4 still extends as far as above the already processed partial regions 3B of the second semiconductor chips CH2.

Figure 1D:
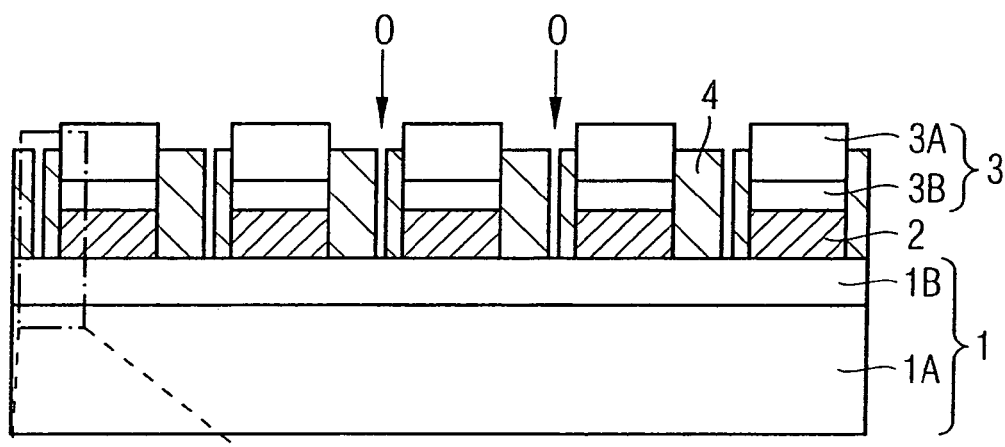

In accordance with FIG. 1D, the thinning of the second semiconductor chips CH2 is followed by the formation of openings O for uncovering bonding connection areas 5 at the contact surface of the wafer 1 or of the first semiconductor chips CH1 that have not yet been singulated.

Figure 1E:
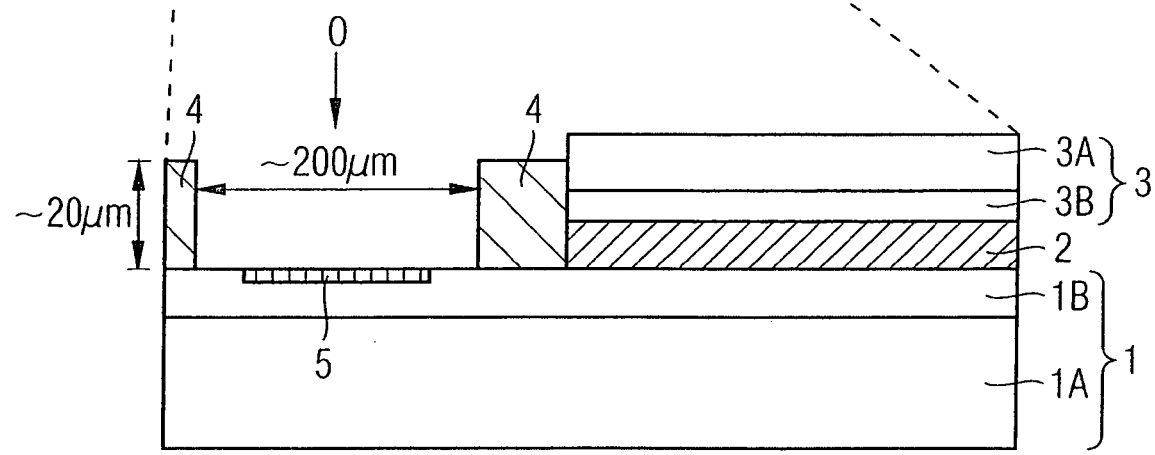

FIG. 1E shows an enlarged partial sectional view of the detail defined in FIG. 1D, where the opening O for uncovering the bonding connection areas 5 may have a width of approximately 50 μm-200 μm. In this case, the bonding connection areas 5 serve e.g. for subsequent wire bonding or flip-chip bonding. In accordance with FIGS. 1D and 1E, the dimensions (contact surface) of the first semiconductor chips CH1 that have been formed in the wafer 1 and have not yet been singulated are preferably greater than the dimensions of the second semiconductor chips CH2 mounted thereon, as a result of which a sufficient area for realizing such bonding connection areas 5 is obtained at the contact surface, that is to say the surface used for the contact-connection or the soldering operation, or alternatively the underlying topmost metallization plane of the first semiconductor chips CH1.

In the course of this formation of the openings O, it is necessary to open both the stabilization layer 4 and a passivation layer, which is possibly present but is not illustrated, above the bonding connection areas or pads 5. For this purpose, it is possible for example for a photoresist to be spun on, exposed and developed. Particularly when using a photoactive stabilization layer such as, for example, photoimide, said stabilization layer 4 can be directly exposed and developed and the opening O can subsequently be implemented with the aid of, for example, a dry/plasma etch or a wet etch. In the case of transparent stabilization layers such as, for example, SOG, polyimide and photoimide, the required alignment of the pad opening phototechnology may be effected at alignment marks in the metallic connection or pad plane. In the case of nontransparent stabilization layers 4 such as, for example, epoxy resin, such an alignment may be carried out by means of the uncovered second semiconductor chips CH2.

Figure 1F:
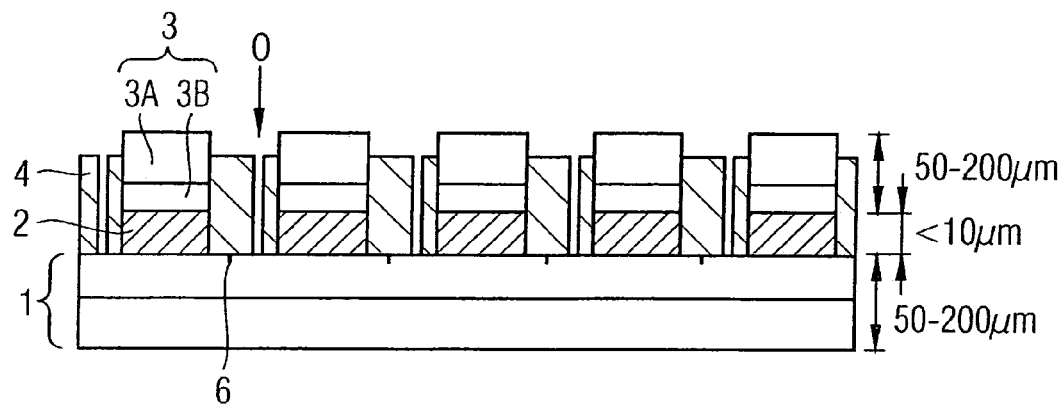

In accordance with FIG. 1F, the wafer 1 with its first semiconductor chips CH1 that have not yet been singulated is then thinned to a desired target thickness, which in turn lies within a range of 50 to 200 μm. The mechanical, chemical or chemical-mechanical methods (CMP, Chemical Mechanical Polishing) or etching methods (wet or dry etch) mentioned in the introduction may once again be carried out in this case.

Figure 1G:
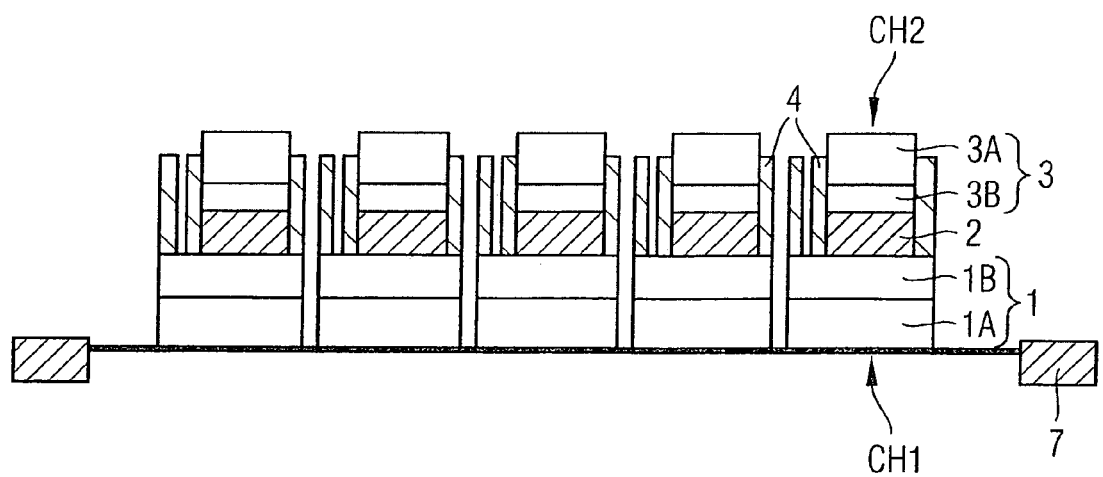

In accordance with FIG. 1G, the thus thinned wafer 1 with the stabilization layer 4 and the thinned second semiconductor chips CH2 is sawn (dicing) in order to produce singulated ultrathin chip stacks with the layers 1, 2 and 3. To put it more precisely, the thinned wafer 1 with the thinned second semiconductor chips CH2 are adhesively bonded onto a sawing frame 7 and sawn along the sawing channels 6 illustrated in FIG. 1F. Finally, the ultrathin chip stacks are mounted for example in chip card or smart card or other suitable housings.

On account of the mechanical stabilization of the second semiconductor chips CH2, it is possible for the first time to realize ultrathin chip stacks with outstanding electrical properties and in conjunction with greatly reduced production costs. Since, in contrast to conventional methods involving the formation of a bonding connection opening prior to soldering, according to the disclosure the opening of the bonding connection areas for wire bonding and flip-chip pads is preferably carried out after soldering and in particular after the thinning of the second semiconductor chips CH2, the connection areas remain protected for a long time, whereby contact-connection is in turn improved, additional phototechnology for freeing the connection areas of the stabilization layer furthermore being obviated.

Figure 2A:
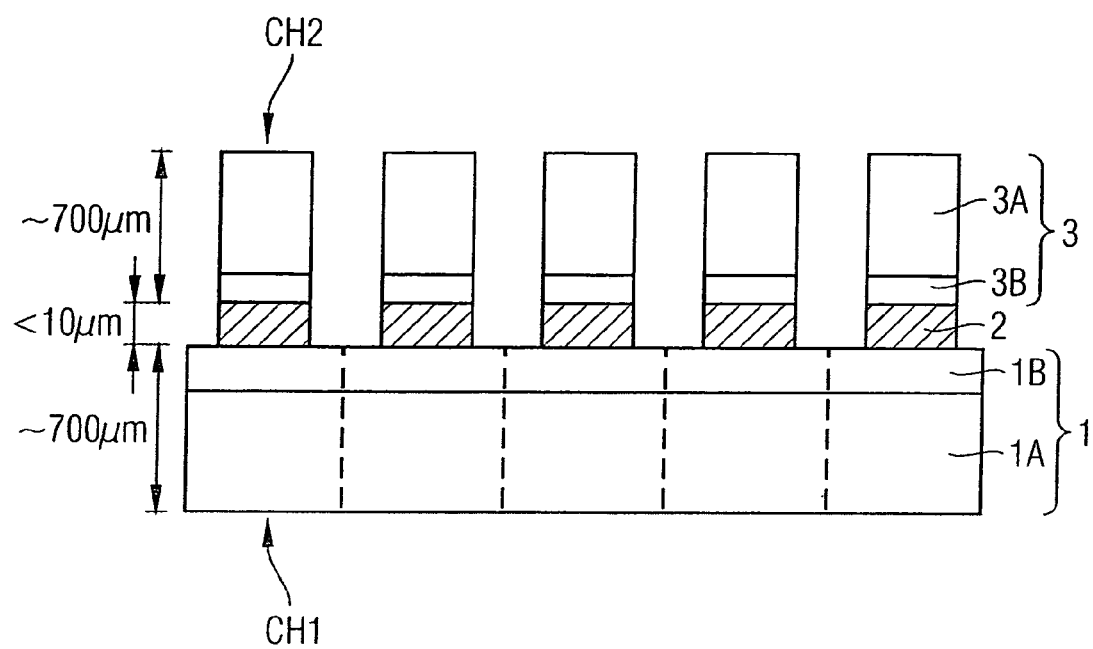
FIGS. 2A to 2C show simplified sectional views illustrating production steps of another embodiment of a method for producing ultrathin chip stacks.
Figure 2B:
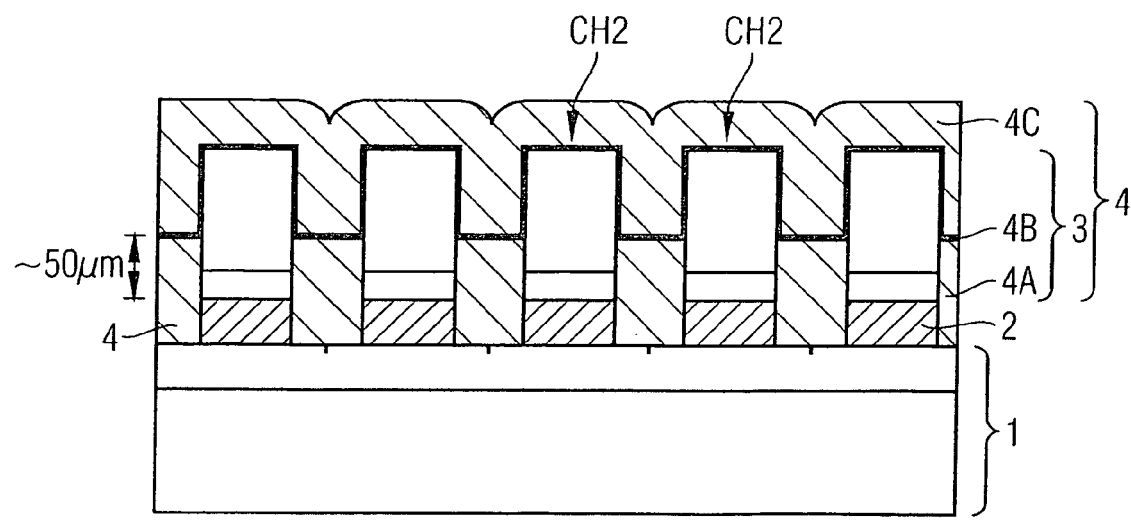
Figure 2C:
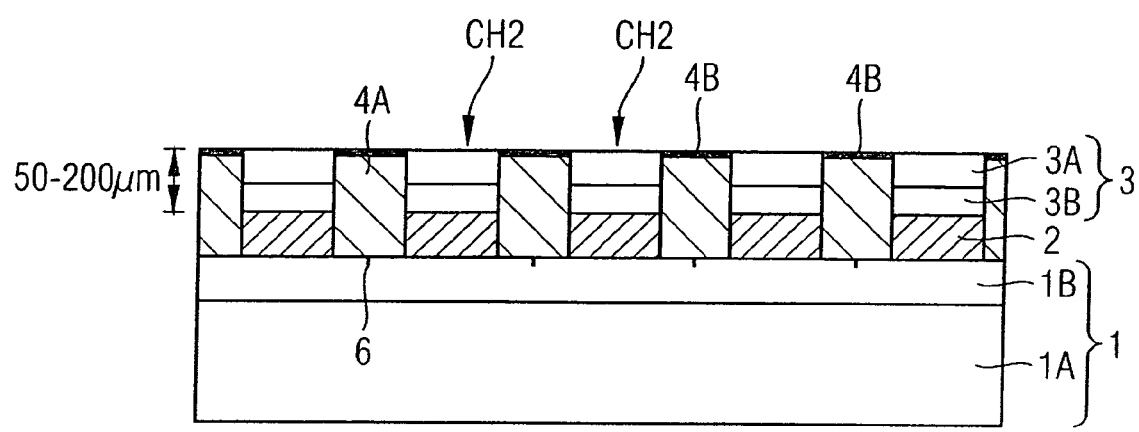

FIGS. 2A to 2C show simplified sectional views illustrating production steps in another embodiment of a method for producing ultrathin chip stacks, identical reference symbols designating layers identical or corresponding to those in FIGS. 1A to 1G, and a repeated description being dispensed with below.

In accordance with FIG. 2A, a face-to-face bonding of as yet unthinned semiconductor chips on an as yet unthinned wafer 1 is once again carried out as in the case of the prior art or in the case of the first exemplary embodiment.

In accordance with FIG. 2B, subsequently a stabilization partial layer 4A for mechanical stabilization is once again formed up to a predetermined height in the interspaces between the second semiconductor chips CH2, for example by means of a spin-on method, and cured. The materials used are preferably the materials in accordance with the first exemplary embodiment. The thickness of this partial stabilization layer 4A should preferably define a target thickness of the second semiconductor chips CH2 to be thinned and lie above an already processed partial region 3B of the second semiconductor chips CH2. As an alternative, the interspaces may also be completely filled as in FIG. 1B and an etching-back of the stabilization partial layer 4A may subsequently be carried out.

A CMP or etching stop layer 4B is subsequently formed, an approximately 500 nm thick SiN layer being deposited over the full area preferably by means of a PECVD method. Afterward, in accordance with FIG. 2B a second stabilization partial layer 4C is spun on and cured, an SOG or epoxy resin layer, in particular, being used.

In accordance with FIG. 2C, subsequently in a two-stage or multistage grinding, etching and/or CMP process, firstly the second stabilization partial layer 4C, the CMP or etching stop layer 4B and the Si semiconductor material 3A are ground back or etched back nonselectively to near, i.e. approximately 10 to 15 μm above, the target thickness of the second semiconductor chip CH2. A selective grinding or CMP process is subsequently effected, during which the semiconductor material 3A of the second semiconductor chips CH2 and also the second stabilization partial layer 4C are removed selectively with respect to the CMP or etching stop layer 4B. In this case, an automatic stop is obtained on the planar partial regions of the CMP or etching stop layer 4B, as a result of which a target thickness of the semiconductor chips CH2 can be set highly precisely.

Optionally, it is then possible for the SiN CMP or etching stop layer 4B also to be removed by means of a dry or wet etch. In accordance with FIG. 2C, if required said CMP stop layer may, however, also be retained as an additional passivation layer.

Afterward, as in the case of the first exemplary embodiment in accordance with FIGS. 1D to 1G, the bonding connection areas 5 are opened, the wafer 1 is thinned to its target thickness and the ultrathin chip stack is sawn for singulation and mounted into a housing.

As an alternative, in the case of this second exemplary embodiment, it is also possible to dispense with the first partial stabilization layer 4A and to form, as bottommost layer, only a CMP or etching stop layer 4B up to a predetermined height in the interspaces of the second semiconductor chips CH2.

Figure 3A:
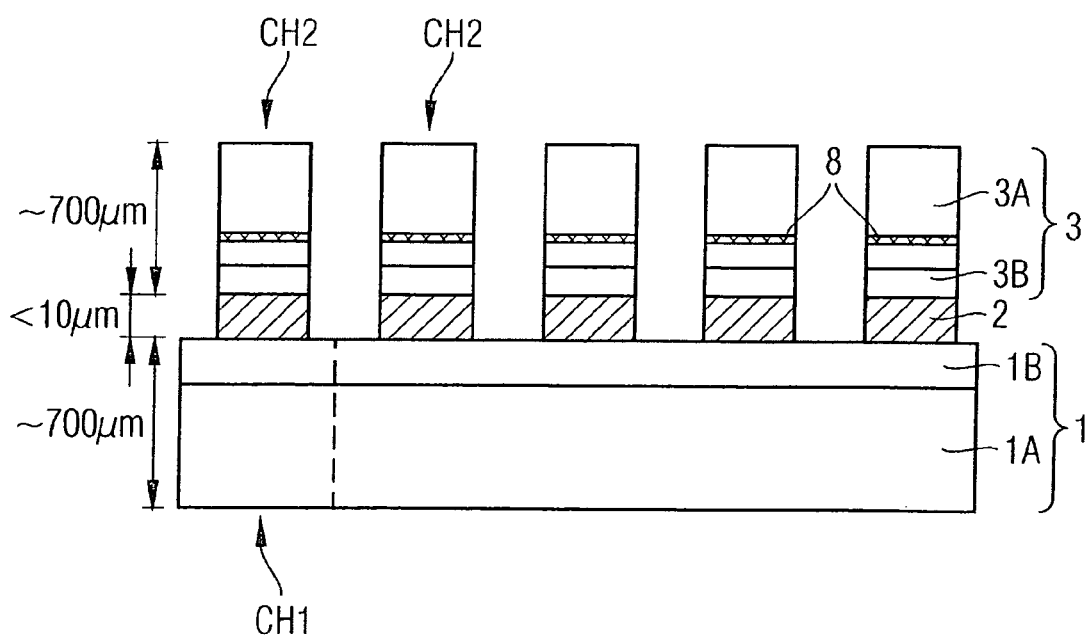
FIGS. 3A to 3C show simplified sectional views illustrating production steps of another embodiment of a method for producing ultrathin chip stacks.
Figure 3B:
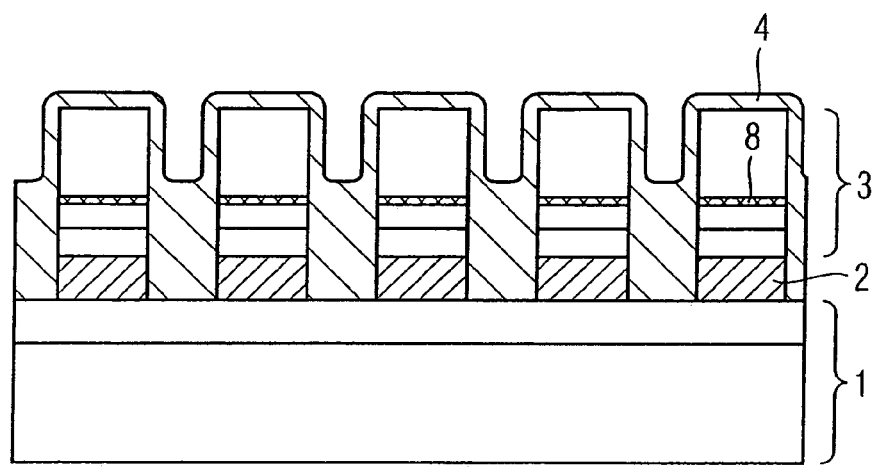
Figure 3C:
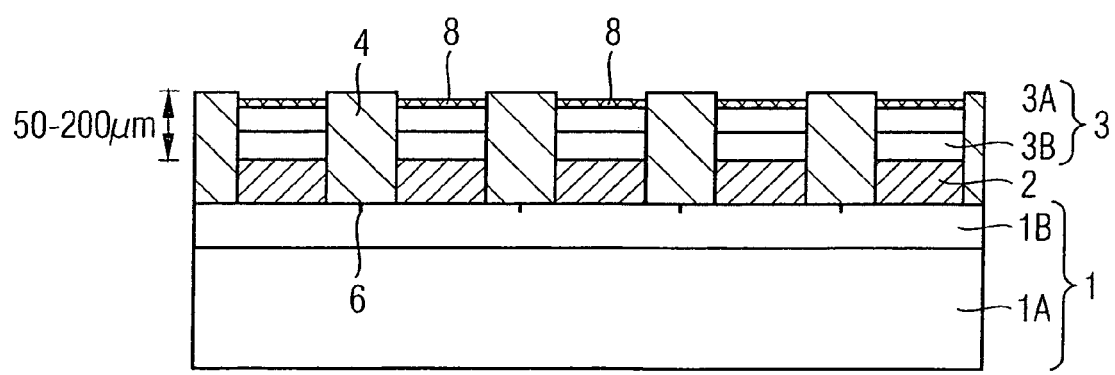

FIGS. 3A to 3C show simplified sectional views illustrating production steps in another embodiment of a method for producing ultrathin chip stacks, identical reference symbols designating layers or elements identical to those in FIGS. 1 and 2, for which reason a repeated description is dispensed with below.

Once again, as in the case of the prior art or in the case of the first and second exemplary embodiments, firstly semiconductor chips CH2 that have already been singulated are soldered onto a wafer 1 with as yet unsingulated semiconductor chips CH1 or are connected to an intermetallic connecting layer 2 in accordance with FIG. 3A.

In contrast to the exemplary embodiments described above, however, a semiconductor substrate with a buried etching stop layer 8 is now used in particular for the second semiconductor chips CH2. An etching stop layer 8 of this type may be for example an $SiO_2$ layer which, in the case of SOI substrates (Silicon On Insulator) is present at a depth of approximately 5 to 50 μm. In principle, the wafer could also have such an SOI substrate or such an etching stop layer 8.

In accordance with FIG. 3B, the interspace between the singulated second semiconductor chips CH2 is subsequently once again filled up to a predetermined height, which preferably lies above the etching stop layer 8, it once again being possible to implement the materials and also spin-on methods and thermal steps mentioned in the introduction. The layer thickness of the stabilization layer 4 within the interspaces should accordingly be greater than the sum composed of the thickness of the connecting layer 2 after the soldering operation or the F2F mounting and the depth of the etching stop layer 8 of the processed semiconductor chip.

In accordance with FIG. 3C, the stabilization layer 4 is subsequently removed at the rear-side surface of the second semiconductor chips CH2 and at their sidewalls by means of an isotropic etch, dilute hydrofluoric acid (HF) preferably being implemented when using SOG as the stabilization layer or $O_2$ plasma etching preferably being implemented when using polyimide or photoimide. Since the stabilization layer 4 is thinner at the surface and the sidewalls than in the interspaces between the second semiconductor chips, at least the upper part of the semiconductor material 3A of the second semiconductor chips CH2 is uncovered, in which case the residual thickness of the stabilization layer 4 within the interspace should still project beyond the buried etching stop layer 8.

Afterward, the semiconductor material or the bulk Si of the second semiconductor chips CH2 is etched back by means of wet-chemical etching selectively with respect to the etching stop layer 8 or the $SiO_2$. In this case, the etching stops automatically on the buried $SiO_2$ layer. Said wet-chemical etching is preferably carried out in a single-wafer installation in which only the contact surface (front side) of the wafer 1 and the uncovered rear sides of the second semiconductor chips CH2 are exposed to the etching chemical.

Figure 4:
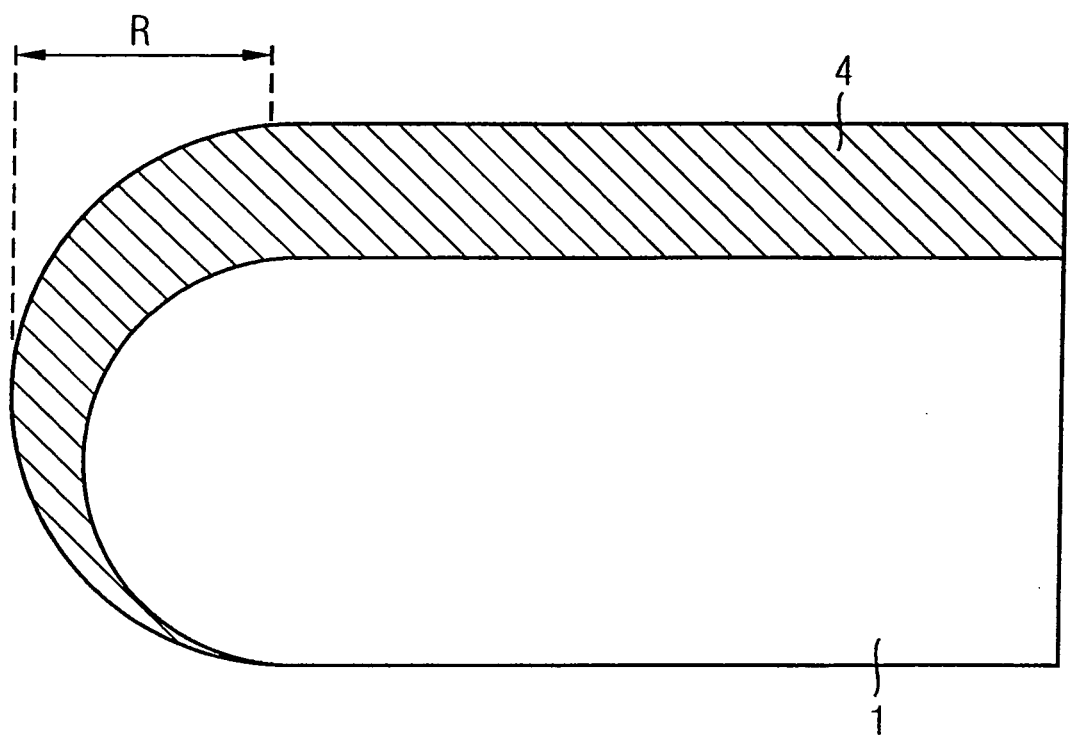
FIG. 4 shows a simplified sectional view illustrating a wafer edge region protected by a stabilization layer.

In accordance with FIG. 4, the spin-on method is set in such a way that the deposited stabilization layer 4 completely encloses the wafer edge or the peripheral region R of the wafer 1, thereby avoiding a possible attack by the etching chemical on the Si substrate of the wafer 1 during the wet-chemical, in particular Si etching.

Afterward, as in the case of the first and second exemplary embodiments in accordance with FIGS. 1D to 1G, once again the bonding connection areas 5 are opened, the wafer 1 is thinned and then sawn apart in order finally to mount the ultrathin chip stacks in the housing.

On account of the wet etching used in the case of the third exemplary embodiment, a mechanical loading particularly on the connecting layer 2 is extremely small, thus resulting in a minimal contact degradation between first and second semiconductor chips. Furthermore, it is possible to realize chip stacks having very small total thicknesses since the buried etching stop layer 8 in SOI substrates usually has a very small depth.

Although, in accordance with the third exemplary embodiment described above, an etching stop layer 8 is preferably present in the wafer 1 and/or the semiconductor material of the second semiconductor chips CH2, such etching stop layers 8 may also be absent, in which case a timed wet-chemical etching to a desired target thickness is carried out. In this case, however, a desired target thickness can be set less precisely.

As an alternative, it is also possible to carry out a selective dry etching for etching back the non-processed semiconductor material 3A or Si bulk of the second semiconductor chip CH2.

The present disclosure has been described on the basis of silicon semiconductor wafers and silicon semiconductor components. However, it is not restricted thereto and encompasses any other semiconductor materials in the same way. Furthermore, the disclosure has been described on the basis of preferred materials for the stabilization layer. However, it is not restricted thereto and it also encompasses other materials for the stabilization layer and for the stop layers in the same way.

It is therefore intended that the foregoing detailed description be regarded as illustrative rather than limiting, and that it be understood that it is the following claims, including all equivalents, that are intended to define the spirit and scope of this disclosure.

The invention claimed is:

1. An apparatus for producing chip stacks, comprising:
   means for forming a plurality of unsingulated first semiconductor chips in a wafer, each of the plurality of unsingutated first semiconductor chips comprising a first chip connection area;
   means for applying a singutated second semiconductor chip via an electrically conductive layer to each of the plurality of unsingulated first semiconductor chips, each of the unsingulated first semiconductor chip and singulated second semiconductor chips being permanently electrically connected;
   means for filling a continuous interspace region that extends between each of the singutated second semiconductor chips with a stabilization layer up to a predetermined height;
   means for thinning at least one of the wafer, the stabilization layer, and the singulated second semiconductor chips;
   means for forming an opening that extends through the stabilization layer to an electrical connection area at a surface of the wafer; and
   means for sawing the wafer to produce a plurality of singulated chip stacks, wherein the interspace region extends to a top surface of the chip stack.

2. A chip stack comprising:
   a first semiconductor chip comprising at least one first chip connection area;
   a second semiconductor chip comprising at least one second chip connection area;
   a connecting layer permanently connecting the first semiconductor chip and the second semiconductor chip via the at least one first chip connection area and the at least one second chip connection area;
   a stabilization layer formed at at least a portion of the second semiconductor chip, connecting layer, and first semiconductor chip wherein an upper surface of the stabilization layer is below or at a same level as an upper surface of the chip stack; and an opening that extends through the stabilization layer to an electrical connection area of the chip stack;

wherein the first semiconductor chip has a thickness of between 50 and 200 um, the connecting layer has a thickness of less than 10 um, and the second semiconductor chip has a thickness of between 50 and 200 um.

3. The chip stack of claim 2, wherein the stabilization layer comprises an insulating layer.

4. The chip stack of claim 2, wherein the stabilization layer comprises a plurality of partial layers.

5. The chip stack of claim 2, wherein the stabilization layer comprises an approximately 500 nm thick SiN layer.

6. The chip stack of claim 2, wherein the second semiconductor chip comprises an $SiO_2$ layer.

7. An apparatus for producing chip stacks, comprising:
- means for forming a plurality of unsingulated first semiconductor chips in a wafer, each of the plurality of unsingulated first semiconductor chips comprising a first chip connection area;
- means for applying a singulated second semiconductor chip via an electrically conductive layer to each of the plurality of unsingulated first semiconductor chips, each of the unsingulated first semiconductor chip and singutated second semiconductor chips being permanently electrically connected;
- means for filling a continuous interspace that extends between each of the singulated second semiconductor chips with a stabilization layer up to a predetermined height;
- means for thinning at least one of the wafer, the stabilization layer, and the singulated second semiconductor chips to a predetermined distance from a stop layer in at least one of the wafer, the stabilization layer, and the singutated second semiconductor chips;
- means for thinning at least one of the wafer, the stabilization layer, and the singulated second semiconductor chips to the stop layer in at least one of the wafer, the stabilization layer, and the singulated second semiconductor chips wherein the stop layer substantially automatically stops the thinning means; and
- means for sawing the wafer to produce a plurality of singulated chip stacks;
- means for forming an opening that extends through the filled interspace region to a bonding connection area at a surface of the wafer before sawing the wafer.

8. The apparatus of claim 7, wherein the thinning to a predetermined distance from the stop layer and the thinning to the stop layer are performed using different thinning techniques.

* * * * *